US009793403B2

(12) United States Patent
Obradovic et al.

(10) Patent No.: US 9,793,403 B2
(45) Date of Patent: Oct. 17, 2017

(54) MULTI-LAYER FIN FIELD EFFECT TRANSISTOR DEVICES AND METHODS OF FORMING THE SAME

(71) Applicants: Borna J. Obradovic, Leander, TX (US); Robert C. Bowen, Austin, TX (US); Titash Rakshit, Austin, TX (US); Wei-E Wang, Austin, TX (US); Mark S. Rodder, Dallas, TX (US)

(72) Inventors: Borna J. Obradovic, Leander, TX (US); Robert C. Bowen, Austin, TX (US); Titash Rakshit, Austin, TX (US); Wei-E Wang, Austin, TX (US); Mark S. Rodder, Dallas, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/054,469

(22) Filed: Feb. 26, 2016

(65) Prior Publication Data
US 2016/0308055 A1    Oct. 20, 2016

Related U.S. Application Data

(60) Provisional application No. 62/147,240, filed on Apr. 14, 2015, provisional application No. 62/156,508, filed on May 4, 2015.

(51) Int. Cl.
| *H01L 29/78* | (2006.01) |
| *H01L 29/786* | (2006.01) |
| *H01L 29/06* | (2006.01) |
| *H01L 29/10* | (2006.01) |
| *H01L 29/66* | (2006.01) |

(52) U.S. Cl.
CPC ...... *H01L 29/7849* (2013.01); *H01L 29/0673* (2013.01); *H01L 29/1054* (2013.01); *H01L 29/66795* (2013.01); *H01L 29/785* (2013.01); *H01L 29/78648* (2013.01); *H01L 29/78696* (2013.01)

(58) Field of Classification Search
CPC ............. H01L 29/7849; H01L 29/0673; H01L 29/78648; H01L 29/78696
USPC .................................................. 257/190, 194
See application file for complete search history.

(56) References Cited

U.S. PATENT DOCUMENTS

| 7,476,930 B2 | 1/2009 | Allibert et al. |
| 8,592,918 B2 | 11/2013 | Yuan et al. |
| 8,753,942 B2 | 6/2014 | Kuhn et al. |

(Continued)

*Primary Examiner* — Cuong Q Nguyen
*Assistant Examiner* — Tong-Ho Kim
(74) *Attorney, Agent, or Firm* — Myers Bigel, P.A.

(57) ABSTRACT

Multi-layer fin field effect transistor devices and methods of forming the same are provided. The devices may include a fin shaped channel structure on a substrate. The channel structure may include stressor layers stacked on the substrate and a channel layer between the stressor layers, and the stressor layers may include a semiconductor material having a wide bandgap that is sufficient to confine carriers to the channel layer and having a lattice constant different from a lattice constant of the channel layer to induce stress in the channel layer. The devices may also include source/drain regions on respective first opposing sides of the channel structure and a gate on second opposing sides of the channel structure and between the source/drain regions.

20 Claims, 16 Drawing Sheets

(56) References Cited

U.S. PATENT DOCUMENTS

| | | |
|---|---|---|
| 8,823,102 B2 | 9/2014 | van Dal et al. |
| 8,952,420 B1 | 2/2015 | Loubet et al. |
| 8,994,002 B2 | 3/2015 | Lee et al. |
| 9,000,498 B2 | 4/2015 | Morin |
| 9,012,284 B2 | 4/2015 | Glass et al. |
| 9,023,705 B1 | 5/2015 | Paul et al. |
| 9,059,207 B2 | 6/2015 | Adam et al. |
| 9,099,559 B2 | 8/2015 | Morin et al. |
| 9,171,904 B2 | 10/2015 | Eneman et al. |
| 2003/0025131 A1* | 2/2003 | Lee ................ H01L 21/823807 257/200 |
| 2009/0310431 A1* | 12/2009 | Saito .................... H01L 27/108 365/207 |
| 2011/0163360 A1* | 7/2011 | Zhang ............... H01L 21/26506 257/288 |
| 2012/0292665 A1* | 11/2012 | Marino ............... H01L 29/1029 257/194 |
| 2013/0270512 A1 | 10/2013 | Radosavljevic et al. |
| 2013/0320294 A1 | 12/2013 | Cappellani et al. |
| 2014/0008730 A1* | 1/2014 | Mitard .................. H01L 27/092 257/369 |
| 2014/0131660 A1 | 5/2014 | Cea et al. |
| 2014/0273418 A1* | 9/2014 | Cheng ............... H01L 29/66484 438/479 |
| 2014/0346564 A1* | 11/2014 | Doornbos ....... H01L 21/823412 257/190 |
| 2015/0162405 A1* | 6/2015 | Yang .................. H01L 29/1045 257/76 |
| 2015/0162447 A1 | 6/2015 | Lee et al. |
| 2015/0228648 A1 | 8/2015 | Chi et al. |
| 2015/0295084 A1 | 10/2015 | Obradovic et al. |

* cited by examiner

MULTI-LAYER FIN FIELD EFFECT TRANSISTOR DEVICES AND METHODS OF FORMING THE SAME

CROSS-REFERENCE TO RELATED APPLICATIONS

This application claims priority from U.S. Provisional Patent Application No. 62/147,240, entitled "Multi-layer finFET device with low defectivity and high channel strain" filed on Apr. 14, 2015, and U.S. Provisional Patent Application No. 62/156,508, entitled "A Multi-Layer FinFET Device with Low Defectivity and High Channel Strain" filed on May 4, 2015, the disclosures of which are incorporated by reference herein in their entireties.

BACKGROUND

The present inventive concepts relate to semiconductor devices, and more particularly, to semiconductor field effect transistor devices.

Mobility enhancement by using strained channels has been researched to achieve desired transistor performance at sub-10 nm technology nodes. Some conventional approaches, however, may not be used to form tall and highly strained channels and/or may result in strained channels including a high density of defects.

SUMMARY

A field effect transistor may include a fin shaped channel structure on a substrate. The channel structure may include stressor layers stacked on the substrate and a channel layer between the stressor layers, and the stressor layers may include a semiconductor material having a wide bandgap that is sufficient to confine carriers to the channel layer and having a lattice constant different from a lattice constant of the channel layer to induce stress in the channel layer. The transistor may also include source/drain regions on respective first opposing sides of the channel structure and a gate on second opposing sides of the channel structure and between the source/drain regions.

According to various embodiments, the gate may not be disposed between the channel layer and the stressor layers.

In various embodiments, the gate may extend on a surface of the channel structure, and a portion of the gate may separate the channel structure from the substrate.

In various embodiments, the channel layer may contact the stressor layers.

According to various embodiments, each of the channel layer and the stressor layers may have a thickness in a vertical direction that is perpendicular to an upper surface of the substrate in a range of about 4 nm to about 20 nm.

According to various embodiments, a lowermost surface of the channel structure may be spaced apart from the substrate.

In various embodiments, the transistor may further include diffusion barrier layers between the channel layer and the stressor layers.

According to various embodiments, each of the diffusion barrier layers may have a thickness in a vertical direction that is perpendicular to an upper surface of the substrate of less than 5 nm.

According to various embodiments, each of the diffusion barrier layers may include Zinc sulfide (ZnS) and/or a group II-VI semiconductor material.

In various embodiments, the field effect transistor may be an N-type field effect transistor, the channel layer may include silicon, and each of the stressor layers may include beryllium telluride (BeTe), aluminum arsenide (AlAs), lanthanum oxide ($La_2O_3$) and/or zinc selenide (ZnSe).

In various embodiments, the field effect transistor may be a P-type field effect transistor, the channel layer may include silicon germanium ($Si_{1-x}Ge_x$), and x may be greater than 0.2, and each of the stressor layers may include aluminum phosphide (AlP) and/or gallium phosphide (GaP).

According to various embodiments, the field effect transistor may be a P-type field effect transistor, the channel layer may include silicon germanium ($Si_{1-x}Ge_x$), and each of the stressor layers may include beryllium sulfide (BeS) and/or beryllium selenide (BeSe).

In various embodiments, the field effect transistor may be a P-type field effect transistor, the channel layer may include indium-gallium-antimonide ($In_xGa_{1-x}Sb$), and each of the stressor layers may include $In_yGa_{1-y}Sb$, and x may be greater than y.

According to various embodiments, the field effect transistor may be a P-type field effect transistor, the channel layer may include $In_xGa_{1-x}Sb$, and each of the stressor layers may include aluminum antimonide (AlSb) and/or indium phosphide (InP).

A field effect transistor may include a fin shaped channel structure on a substrate. The channel structure may include stressor layers stacked on the substrate and a channel layer between the stressor layers. The stressor layers may have a lattice constant different from a lattice constant of the channel layer to induce stress in the channel layer. The transistor may also include source/drain regions on respective first opposing sides of the channel structure and a gate on second opposing sides of the channel structure and between the source/drain regions. A portion of the gate may separate the channel structure from the substrate.

In various embodiments, the gate may extend on a surface of the channel structure and may not be disposed between the channel layer and the stressor layers.

According to various embodiments, the channel layer may contact the stressor layers.

According to various embodiments, each of the channel layer and the stressor layers may have a thickness in a vertical direction that is perpendicular to an upper surface of the substrate in a range of about 4 nm to about 20 nm.

In various embodiments, the transistor may further include diffusion barrier layers between the channel layer and the stressor layers.

According to various embodiments, each of the diffusion barrier layers may have a thickness in a vertical direction that is perpendicular to an upper surface of the substrate of less than 5 nm.

In various embodiments, each of the diffusion barrier layers may include zinc sulfide (ZnS) and/or a group II-VI semiconductor material.

According to various embodiments, the field effect transistor may be an N-type field effect transistor, the channel layer may include silicon, and each of the stressor layers may include beryllium telluride (BeTe), aluminum arsenide (AlAs), lanthanum oxide ($La_2O_3$) and/or zinc selenide (ZnSe).

In various embodiments, the field effect transistor may be a P-type field effect transistor, the channel layer may include silicon germanium ($Si_{1-x}Ge_x$), and x may be greater than 0.2, and each of the stressor layers may include aluminum phosphide (AlP) and/or gallium phosphide (GaP).

According to various embodiments, the field effect transistor may be a P-type field effect transistor, the channel layer may include silicon germanium ($Si_{1-x}Ge_x$), and each of the stressor layers may include beryllium sulfide (BeS) and/or beryllium selenide (BeSe).

In various embodiments, the field effect transistor may be a P-type field effect transistor, the channel layer may include indium-gallium-antimonide ($In_xGa_{1-x}Sb$), and each of the stressor layers may include $In_yGa_{1-y}Sb$, and x may be greater than y.

According to various embodiments, the field effect transistor may be a P-type field effect transistor, the channel layer may include indium-gallium-antimonide ($In_xGa_{1-x}Sb$), and each of the stressor layers may include aluminum antimonide (AlSb) and/or indium phosphide (InP).

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Aspects of the present disclosure are illustrated by way of example and are not limited by the accompanying Figures with like references indicating like elements.

DETAILED DESCRIPTION

Figure 1:
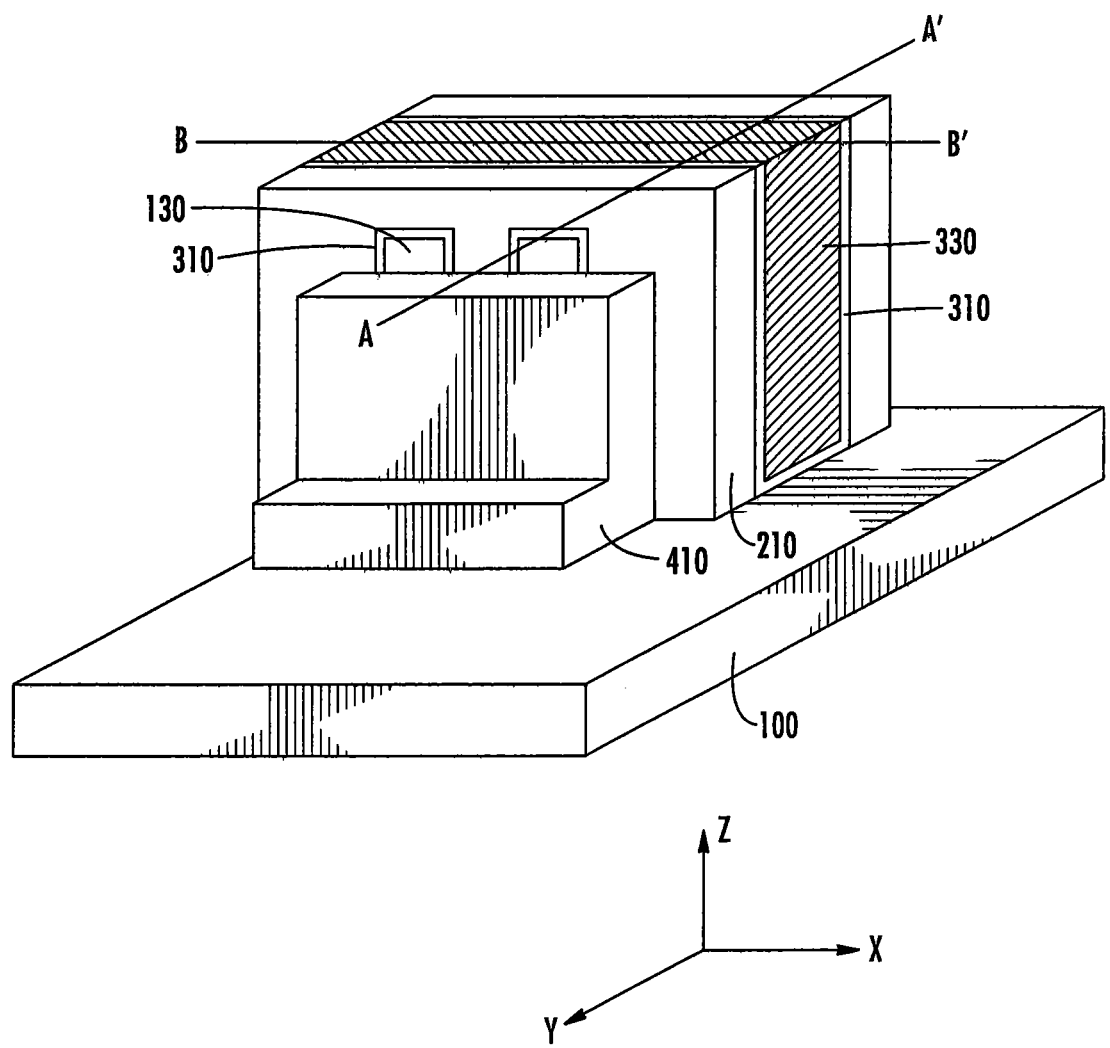
FIG. 1 is a perspective view illustrating a field effect transistor (FET) device according to some embodiments of the present inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art. In the drawings, the sizes and relative sizes of layers and regions are not shown to scale, and in some instances may be exaggerated for clarity.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concepts. The term "and/or" includes any and all combinations of one or more of the associated listed items.

It will also be understood that when an element is referred to as being "on" or "connected" to another element, it can be directly on or connected to the other element, or intervening elements may be present. In contrast, when an element is referred to as being "directly on" or "directly connected" to another element, there are no intervening elements present. In no event, however, should "on" or "directly on" be construed as requiring a layer to completely cover an underlying layer.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. The regions illustrated in the Figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Stress in a fin-shaped channel region may be induced by lattice mismatch between the channel region and a substrate or by epitaxially grown source/drain regions adjacent the channel region. The approach using lattice mismatch between a channel region and a substrate may use a thick and relaxed semiconductor substrate (e.g., Strain Relaxation Buffer (SRB)), and a lattice-mismatched channel region may be grown on the relaxed semiconductor substrate. As appreciated by the present inventors, a SRB layer may include a high density of defects, and those defects in the SRB layer may propagate into a channel region grown on the SRB layer. Further, a height of a channel region grown on a relaxed semiconductor substrate may be limited by a critical thickness at which relaxation occurs. A channel region that is taller than 30 nm may not have more than approximately 1 gigapascal (GPa) of stress or relaxation will occur. Relaxation may populate the channel region with defects.

As also appreciated by the present inventors, the approach using epitaxially grown source/drain regions may not be effective since a size of the epitaxially grown source/drain regions may be reducing at a greater rate than channel lengths and may result in diminishing stress transferred to the channel region. At best, a few hundred megapascal (MPa) of stress may be available using epitaxially grown source/drain regions. Further, stress induced by epitaxially grown source/drain regions may decrease if portions of the source/drain regions are removed during subsequent processes.

According to some embodiments of the present inventive concepts, a fin-shaped channel structure may include channel layers interleaved with stressor layers, and stress in each channel layer may be achieved through lattice mismatch with stressor layers between which each channel layer is disposed. Accordingly, a SRB (Strain Relaxation Buffer) layer may not be used, and the channel layers may be free from defects originated from a SRB layer. Further, a height of the channel structure may not be limited by a critical thickness of individual channel layers and may be taller than 30 nm since each channel layer has a thickness less than a critical thickness. Still further, stress in the channel layers may not be reduced by removing portions of source/drain regions. In various embodiments of the present inventive concepts, stress of the channel layers may have a magnitude in a range of about 0.5 GPa to about 2.5 Gpa.

Figure 2A:
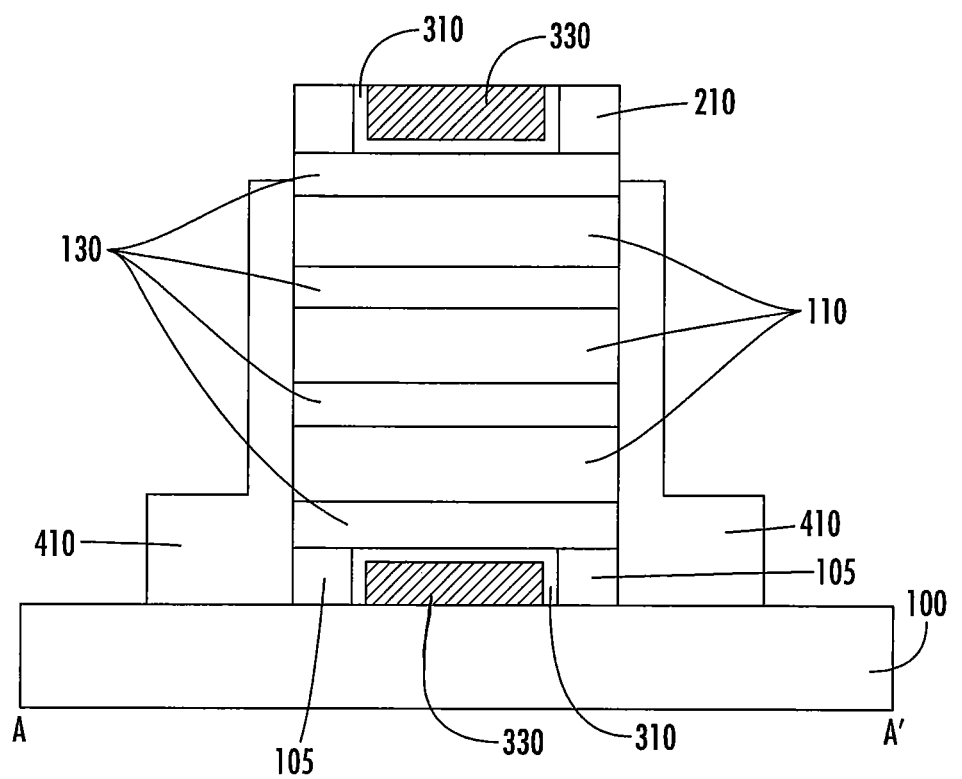
FIGS. 2A and 2B are cross sectional views taken along the lines A-A' and B-B' of FIG. 1, respectively.
Figure 2B:
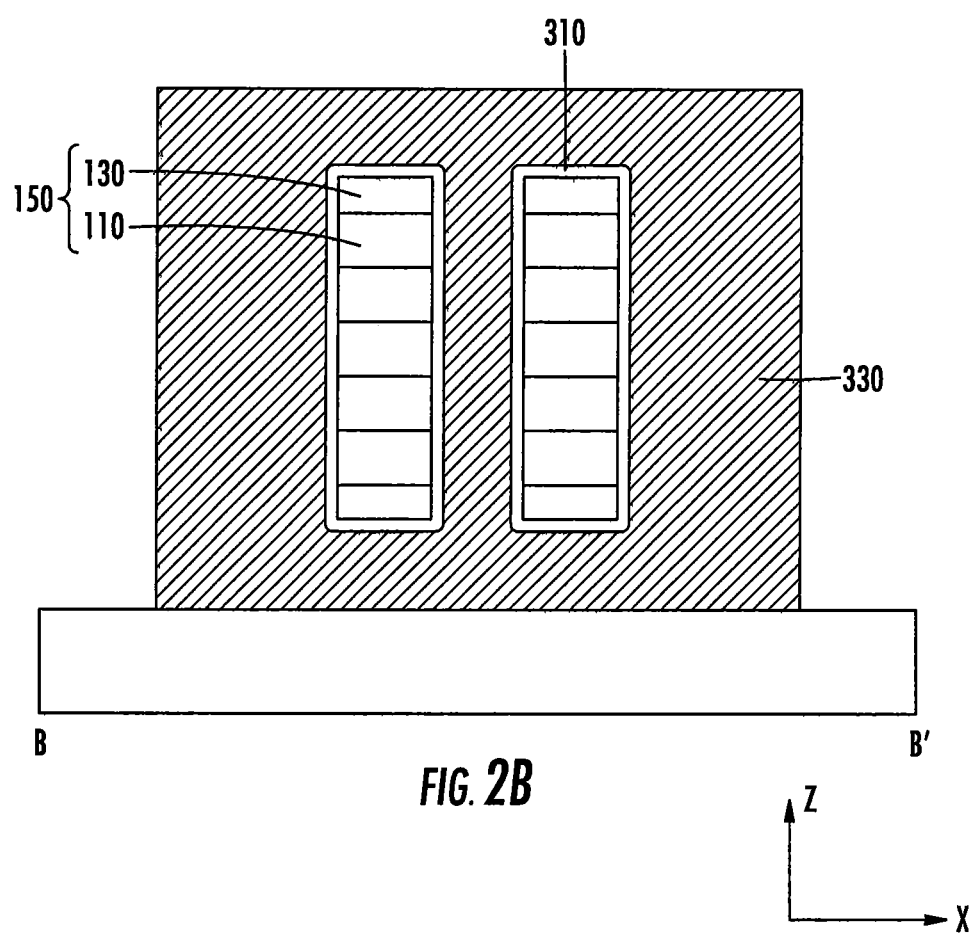

FIG. 1 is a perspective view illustrating a field effect transistor (FET) device according to some embodiments of the present inventive concepts, and FIGS. 2A and 2B are cross sectional views taken along the lines A-A' and B-B' of FIG. 1, respectively. Referring to FIGS. 1, 2A and 2B, the FET device may include a substrate 100. The substrate 100 may be an insulator (e.g., buried oxide) on a substrate, a bulk silicon substrate or a semiconductor on insulator (SOI) substrate. In some embodiments, the substrate 100 may include one or more semiconductor materials, for example, silicon (Si), germanium (Ge), silicon germanium (SiGe), gallium arsenide (GaAs) or silicon germanium carbon (SiGeC).

The FET device may include channel structures 150 that each has a fin shape extending in a Z direction that is perpendicular to an upper surface of the substrate. The channel structures 150 may include channel layers 110 and stressor layers 130 that are stacked in an alternating sequence as illustrated in FIG. 2A. Each of the channel layers 110 may be between two adjacent stressor layers 130, and stress in the channel layers 110 may be achieved through lattice mismatch with the stressor layers 130. In some embodiments, each of the channel layers 110 may contact the stressor layers 130.

The channel layers 110 and the stressor layers 130 may include semiconductor materials. The stressor layers 130 may include a semiconductor material having a wide bandgap that is sufficient to confine carriers to the channel layers 110 such that the stressor layers 130 may function as an insulator during operation the FET device. In some embodiments, a conduction band of the semiconductor material having a wide bandgap may be at least 200 meV above a conduction band of the channel layers 110, and a valence band of the semiconductor material having a wide bandgap may be at least 200 meV below a valence band of the channel layers 110. Stated in other words, no conductive paths may be formed in the stressor layers 130 during operation of the FET device. The stressor layers 130 may have a lattice constant different from a lattice constant of the channel layers 110 to induce stress in the channel layers 110. The stressor layers 130 may induce uniaxial stress (e.g., uniaxial compressive stress or uniaxial tensile stress) in the channel layers 110.

In some embodiments, the channel layers 110 may have a width in a X direction in a range of about 4 nm to about 10 nm. The X direction may be perpendicular to the Z direction. The stressor layers 130 may have a width in the X direction that is the same as or similar to the width of the channel layers 110 in the X direction as illustrated in FIG. 2B. In some embodiments, the stressor layers 130 may have the width in the X direction less than the width of the channel layers 110 in the X direction.

The channel layers 110 each may have a thickness in the Z direction that is less than a critical thickness of the channel layers 100, which may prevent relaxation. The channel layers 110 may have the thickness in the Z direction in a range of about 4 nm to about 30 nm. In some embodiments, the channel layers 110 may have the thickness in the Z direction in a range of about 4 nm to about 20 nm. The stressor layers 130 may have a thickness in the Z direction that is the same as or similar to the thickness of the channel layers 110 in the Z direction. In some embodiments, the thickness of the channel layers 110 may be greater than two times of the width of the channel layers 110, and the FET may be referred to as a FinFET. In some embodiments, the thickness of the channel layers 110 may be similar to the width of the channel layers 110, and the FET may be referred to as a Nanowire FET.

The FET device may include a gate insulating layer 310 and a gate electrode 330 that extend on exterior surfaces of the channel structures 150. The gate electrode 330 may extend in an X direction. The X direction may be perpendicular to both the Z direction and the Y direction. In some embodiments, the gate insulating layer 310 and the gate electrode 330 may not be disposed between the channel layers 110 and the stressor layers 130 as illustrated in FIGS. 2A and 2B. Accordingly, the gate electrode 330 may not wrap around the individual channel layers 110, and the FET device may not have a gate-all-around (GAA) FET structure. In some embodiments, the gate insulating layer 310 and the gate electrode 330 may enclose the channel structures 150 as illustrated in FIG. 2B. The gate electrode 330 may separate the channel structures 150 from the substrate 100. The FET device may also include seed layers 105 between the substrate and the channel structures 150. Although FIG. 1 shows two fin-shaped channel structures 150, in some embodiments of the present inventive concepts, the FET device may include any number of channel structures 150.

In some embodiments, the seed layers 105 and the gate electrode 330 may be disposed between the channel structures 150 and the substrate 100, and the channel structures 150 may not be directly attached to the substrate 100 as illustrated in FIG. 2A. Accordingly, the substrate 100 may not reduce stress in the channel layers 110.

For example, the gate insulating layer 310 may include a high-k material having a higher dielectric constant than silicon oxide such as, for example, hafnium oxide ($HfO_2$), lanthanum oxide, ($La_2O_3$), zirconium oxide, ($ZrO_2$) and/or tantalum oxide ($Ta_2O_5$). In some embodiments, an interface layer may be formed between the channel structures 150 and the gate insulating layer 310. In some embodiments, the gate electrode 330 may include a first gate electrode (e.g., work function regulating electrode) and a second gate electrode that are stacked sequentially on the gate insulating layer 310. For example, the first gate electrode may include one of titanium nitride (TiN), tantalum nitride (TaN), titanium carbide (TiC) and tantalum carbide (TaC), and the second gate electrode may include tungsten (W) or aluminum (Al). In some embodiments, the seed layers 105 may have an etch selectivity with respect to both the channel layers 110 and the stressor layers 130. The seed layers 105 may include, for example, zinc sulfide (ZnS) and/or zinc selenide (ZnSe).

Still referring to FIGS. 1 and 2A, the FET device may include source/drain regions 410 on respective sides of the channel structures 150. The source/drain regions 410 that are electrically connected to the two channel structures 150 each may have a unitary structure and may be referred to as a merged source/drain region. The source/drain regions 410 may include vertical portions that are on the sides of the channel structures 150 and extend in the Z direction. For example, the source and drain regions 410 may include Si. In some embodiments, the source and drain regions 410 may include SiGe when the FET is pFET for better contact resistivity.

In some embodiments, the FET device may be an N-type FET, the channel layers 110 may include silicon, and each of the stressor layers 130 may include beryllium telluride (BeTe), aluminum arsenide (AlAs), lanthanum oxide ($La_2O_3$) and/or zinc selenide (ZnSe).

In some embodiments, the FET device may be a P-type FET, the channel layers 110 may include $Si_{1-x}Ge_x$, and x may be greater than 0.2, and each of the stressor layers 130 may include aluminum phosphide (AlP) and/or gallium phosphide (GaP). In some embodiments, the FET device may be a P-type FET, the channel layers 110 may include $Si_{1-x}Ge_x$ and each of the stressor layers 130 may include beryllium sulfide (BeS) and/or beryllium selenide (BeSe).

In some embodiments, the FET device may be a P-type FET, the channel layers 110 may include $In_xGa_{1-x}Sb$, each of the stressor layers 130 may include $In_yGa_{1-y}Sb$, and x may be greater than y. In some embodiments, the FET device may be a P-type FET, the channel layers 110 may include $In_xGa_{1-x}Sb$, and each of the stressor layers 130 may include aluminum antimonide (AlSb) and/or indium phosphide (InP).

In some embodiments, both an N-type FET and a P-type FET may be formed on the substrate 100. The N-type FET may include a monolithic fin-shaped channel layer that may include indium gallium arsenide (InGaAs) and/or indium-gallium-antimonide (InGaSb), and the P-type FET may be the FET according to some embodiments of the present inventive concepts.

Figure 3:
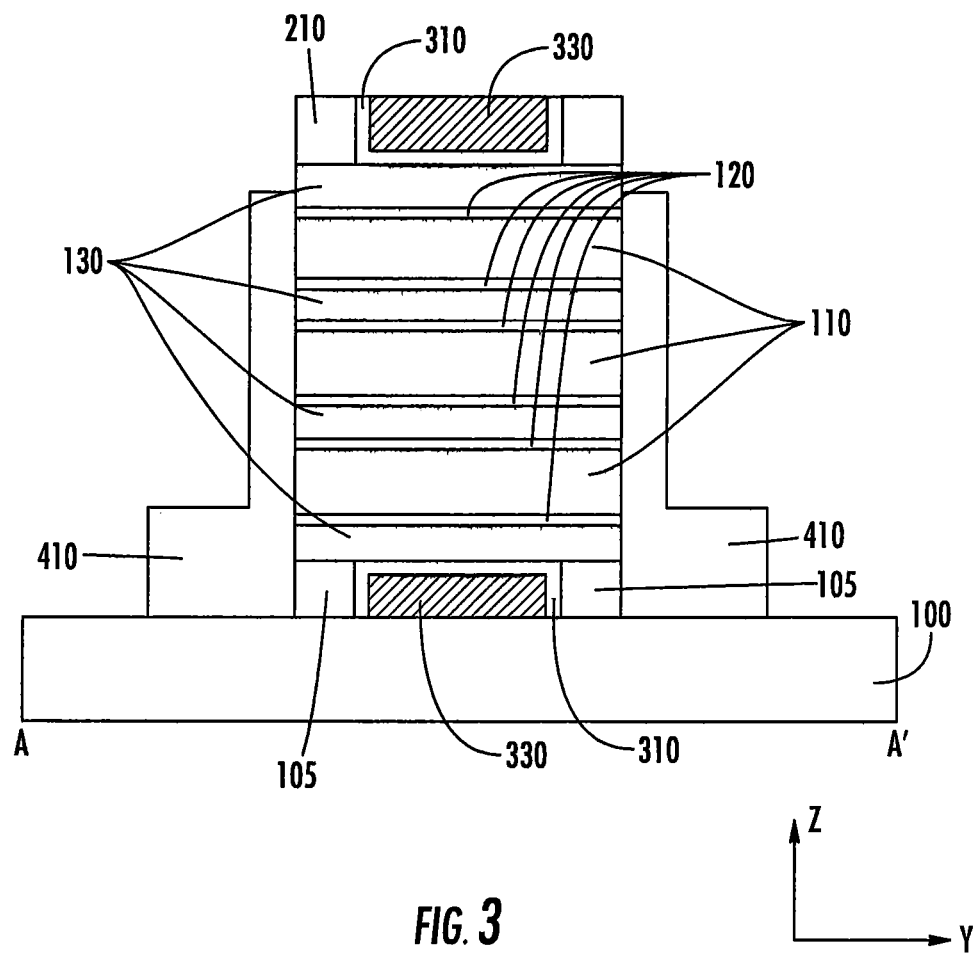
FIG. 3 is a cross sectional view taken along the line A-A' of FIG. 1.

FIG. 3 is a cross sectional view taken along the line A-A' of FIG. 1. The FET device in FIG. 3 may have a structure similar to the FET device in FIG. 2A. The channel structures 150 may additionally include diffusion barrier layers 120 between the channel layers 110 and the stressor layers 130. As appreciated by the present inventors, atoms in the stressor layers 130 may diffuse into the channel layer 110, and the diffused atoms may significantly shift a threshold voltage of the FET device if the diffused atoms are dopants in the channel layers 110 (e.g., silicon). The diffusion barrier layers 120 may reduce or prevent diffusion of atoms in the stressor layers 130 into the channel layers 110. In some embodiments, the diffusion barrier layers 120 may include a crystalline material and may be a mechanically soft material that has about one tenth of an elastic stiffness constant (C11) of silicon. Further, the diffusion barrier layers 120 may not include dopants for the channel layers 110 and may include atoms with low diffusivity in the channel layers 110. In some embodiments, the diffusion barrier layers 120 may not substantially affect the stress of the channel layers 110. For example, the diffusion barrier layers 120 may include ZnS and may have a thickness in the Z direction less than 5 nm.

FIGS. 4, 5, 6A, 7A and 8 are perspective views and FIGS. 6B, 6C, 7B, 9A, 9B, 10A and 10B are cross-sectional views illustrating a method of forming a FET device according to some embodiments of the present inventive concepts.

Figure 4:
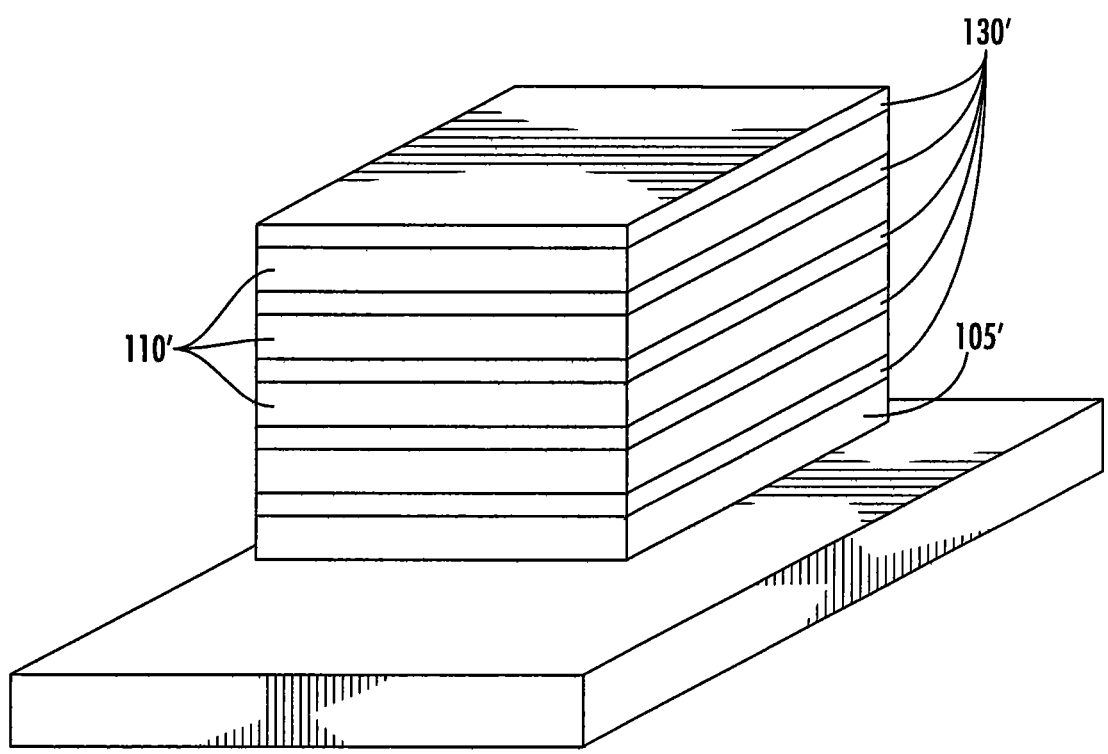
FIGS. 4, 5, 6A, 7A and 8 are perspective views

Referring to FIG. 4, a preliminary seed layer 105' may be formed on a substrate 100. In some embodiments, the preliminary seed layer 105' may be transferred from a donor wafer to the substrate 100 using an appropriate process (e.g., Smart Cut Process). The preliminary seed layer 105' may not include defects or may include a low density of defects. An upper portion of the substrate 100 may be an insulator. The preliminary seed layer 105' may have an etch selectivity with respect to preliminary channel layers 110' and preliminary stressor layers 130' that may be subsequently formed on the preliminary seed layer 105'. For example, the preliminary seed layer 105' may include an alloy of ZnS and ZnSe, and the same preliminary seed layer 105' may be used for both an N-type FET device and a P-type FET device. In some embodiments, the preliminary seed layer 105' may be formed on the substrate 100 using, for example, a deposition process, and a dielectric layer may be formed on the preliminary seed layer 105'. A portion of the dielectric layer may be removed to expose the preliminary seed layer 105' for a subsequent epitaxial growth process.

After the preliminary seed layer 105' is formed, a first mask layer may be formed on a first region of the substrate 100 in which FET devices having a first conductivity type (e.g., N-type) may be formed. The first mask layer may expose a portion of the preliminary seed layer 105' formed on a second region of the substrate 100 in which FET devices having a second conductivity type (e.g., P-type) may be formed. The preliminary stressor layers 130' and the preliminary channel layers 110' may be formed on the portion of the preliminary seed layer 105' that is exposed by the first mask layer using epitaxial growth processes. The preliminary seed layer 105' may be used as a seed layer for the epitaxial growth process. It will be understood that the preliminary stressor layers 130' and the preliminary channel layers 110' may not include defects or may include a low density of defects since the preliminary seed layer 105' may not include defects or may include a low density of defects. The preliminary stressor layers 130' and the preliminary channel layers 110' may be formed in an alternating sequence until a desired number of the preliminary channel layers 110' has been formed. The number of the preliminary channel layers 110' may be chosen to achieve a desired effective channel width and/or a desired effective current of the FET device.

In some embodiments, the FET device may be an N-type FET, the preliminary channel layers 110' may include a silicon, and each of the preliminary stressor layers 130' may include beryllium telluride (BeTe), aluminum arsenide (AlAs), lanthanum oxide ($La_2O_3$) and/or zinc selenide (ZnSe).

In some embodiments, the FET device may be a P-type FET, the preliminary channel layers 110' may include $Si_{1-x}Ge_x$, and x may be greater than 0.2, and each of the preliminary stressor layers 130' may include aluminum phosphide (AlP) and/or gallium phosphide (GaP). In some embodiments, the FET device may be a P-type FET, the preliminary channel layers 110' may include $Si_{1-x}Ge_x$ and each of the preliminary stressor layers 130' may include beryllium sulfide (BeS) and/or beryllium selenide (BeSe).

In some embodiments, the FET device may be a P-type FET, the preliminary channel layers 110' may include $In_xGa_{1-x}Sb$, each of the preliminary stressor layers 130' may include $In_yGa_{1-y}Sb$, and x may be greater than y. In some embodiments, the FET device may be a P-type FET, the preliminary channel layers 110' may include $In_xGa_{1-x}Sb$, and each of the preliminary stressor layers 130' may include aluminum antimonide (AlSb) and/or indium phosphide (InP).

The preliminary channel layers 110' each may have the thickness in the Z direction that is less than a critical thickness of the preliminary channel layers 100 that may prevent relaxation. The preliminary channel layers 110' may have the thickness in the Z direction in a range of about 4 nm to about 30 nm. In some embodiments, the preliminary channel layers 110' may have the thickness in the Z direction in a range of about 4 nm to about 20 nm. The preliminary stressor layers 130' may have a thickness in the Z direction that is the same as or similar to the thickness of the preliminary channel layers 110' in the Z direction.

After the preliminary stressor layers 130' and the preliminary channel layers 110' are formed on the second region of the substrate 100, a second mask layer may be formed on the second region of the substrate 100, and preliminary stressor layers 130' and preliminary channel layers 110' may be formed on the preliminary channel layers 110' on the first region of the substrate 100. For ease of discussion, processes that are performed on the first region of the substrate are discussed herein.

In some embodiments, diffusion buffer layers 120 may be formed between the preliminary stressor layers 130' and the preliminary channel layers 110' to form the device illustrated in FIG. 3. The diffusion buffer layers 120 may be formed by an epitaxial growth process.

Figure 5:
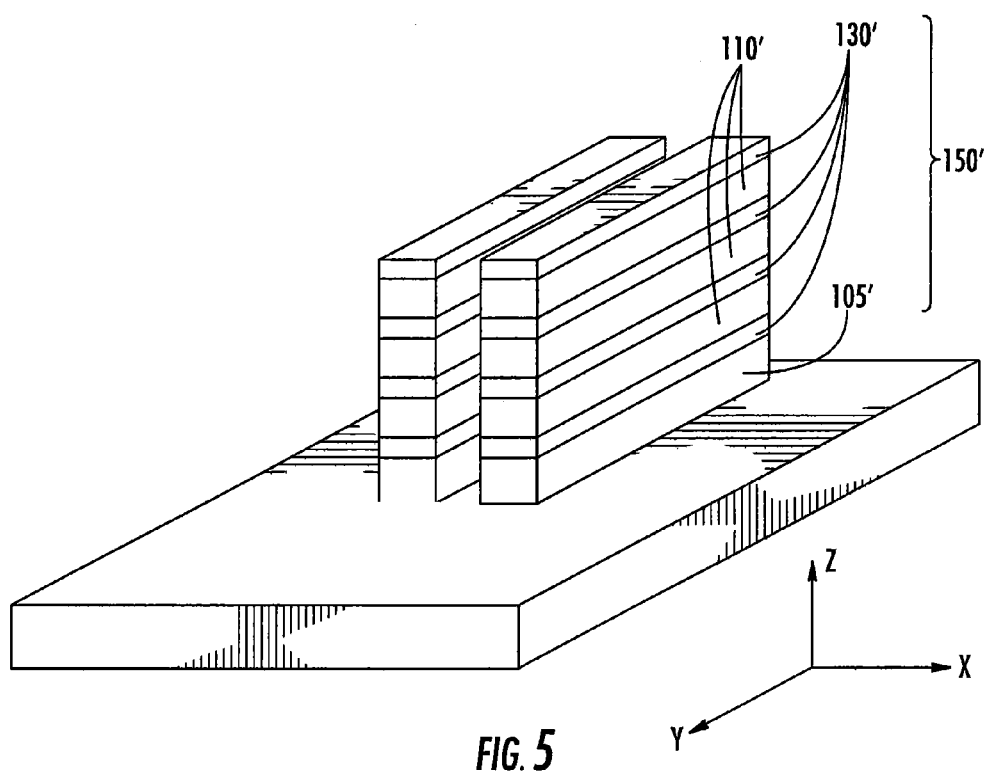

Referring to FIG. 5, the preliminary seed layer 105', the preliminary channel layers 110' and the preliminary stressor layers 130' may be patterned to form preliminary channel structures 150'. In some embodiments, the preliminary channel structures 150' may have vertical sides, and each of preliminary channel structures 150' may have a width in the X direction that is less than 7 nm.

Figure 6A:
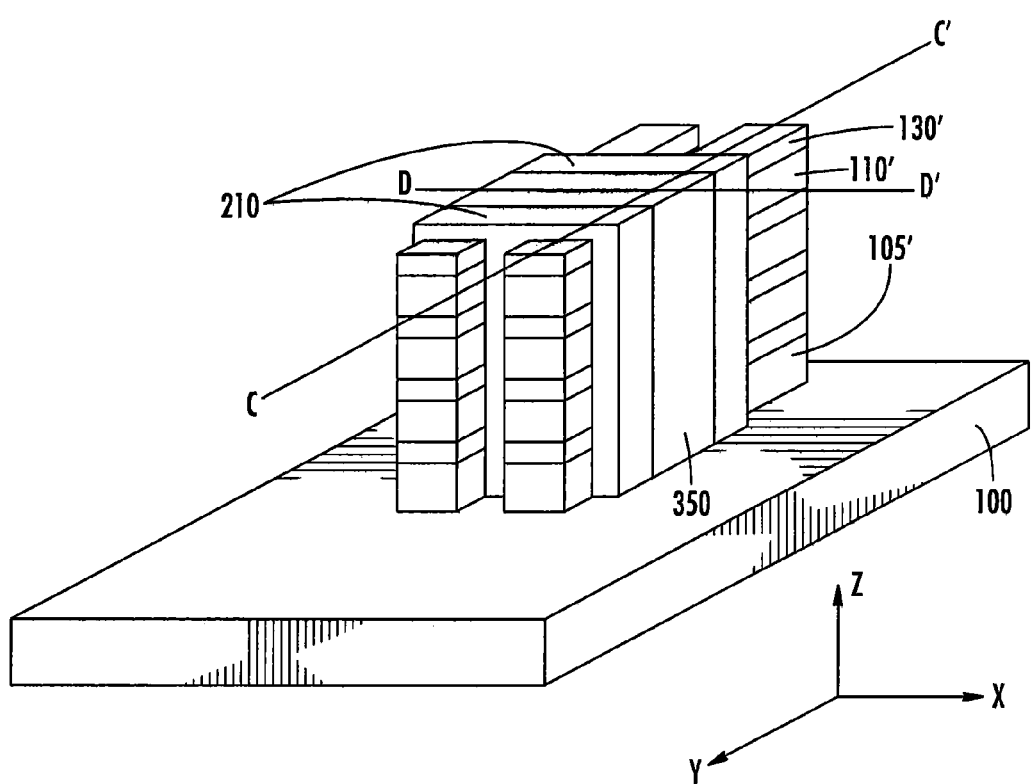
Figure 6B:
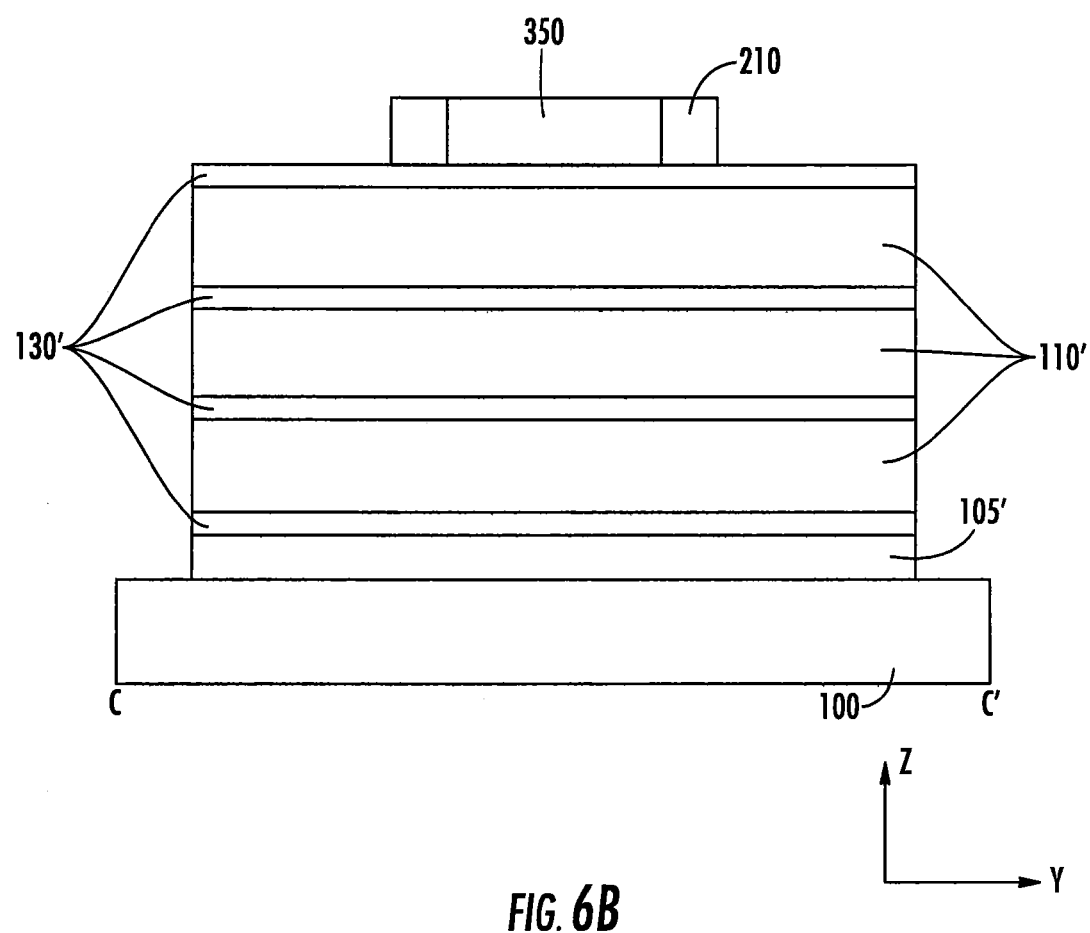
FIGS. 6B, 6C, 7B, 9A, 9B, 10A and 10B are cross-sectional views illustrating a method of forming a FET device according to some embodiments of the present inventive concepts.
Figure 6C:
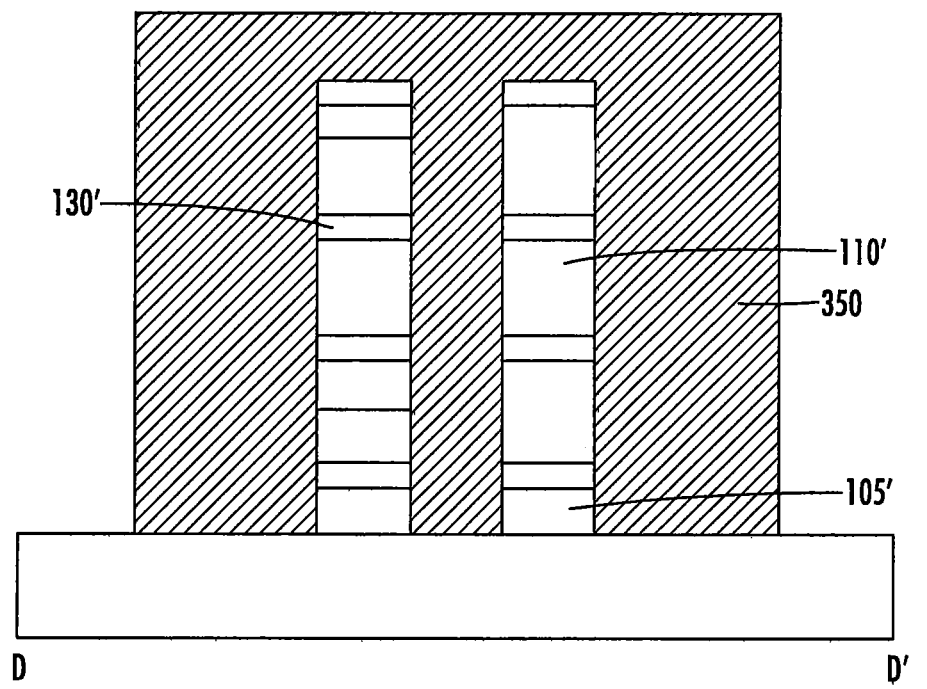

FIGS. 6B and 6C are cross sectional views taken along the lines C-C' and D-D' of FIG. 6A, respectively. Referring to FIGS. 6A, 6B and 6C, a sacrificial gate 350 may be formed on the preliminary channel structures 150'. The sacrificial gate 350 may cross the preliminary channel structures 150'. The sacrificial gate 350 may include a sacrificial gate insulating layer and a sacrificial gate electrode that are sequentially formed on the preliminary channel structures 150'. The sacrificial gate electrode of the sacrificial gate 350 may include, for example, polysilicon. First spacers 210 may be formed on sides of the sacrificial gate 350. The first spacers 210 may include a material that has an etch selectivity with respect to the sacrificial gate 350, and the first spacers 210 may include, for example, silicon nitride.

Figure 7A:
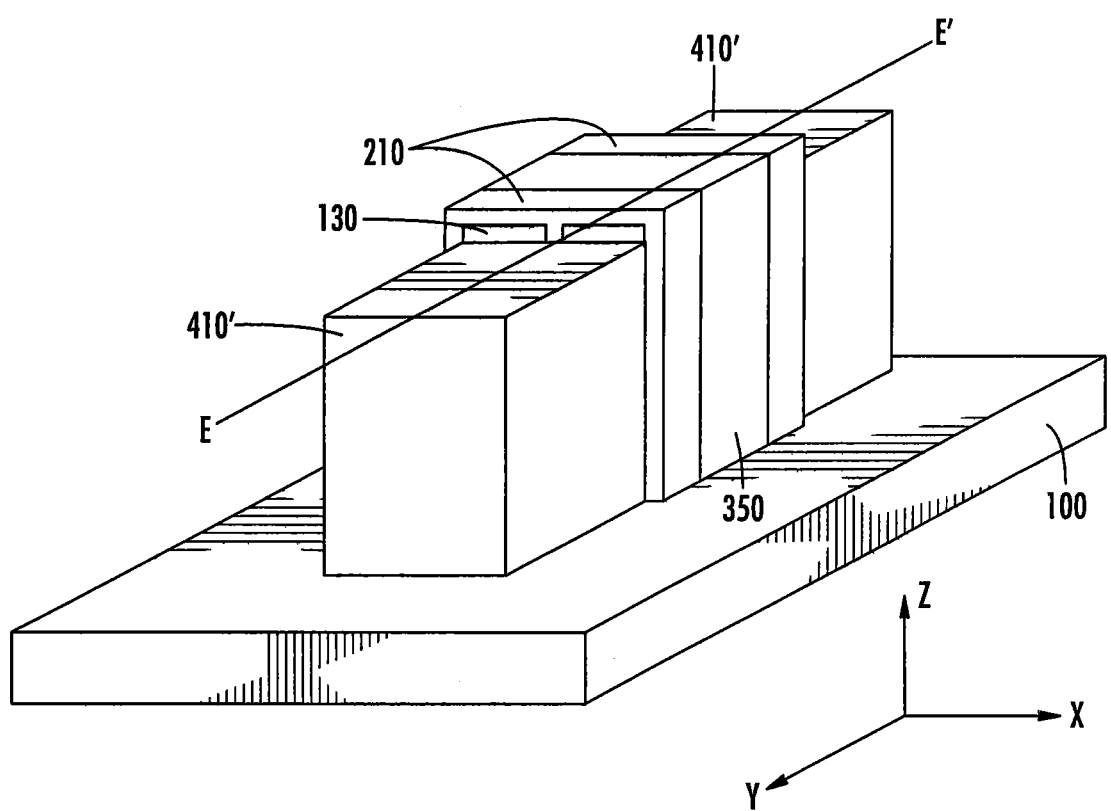
Figure 7B:
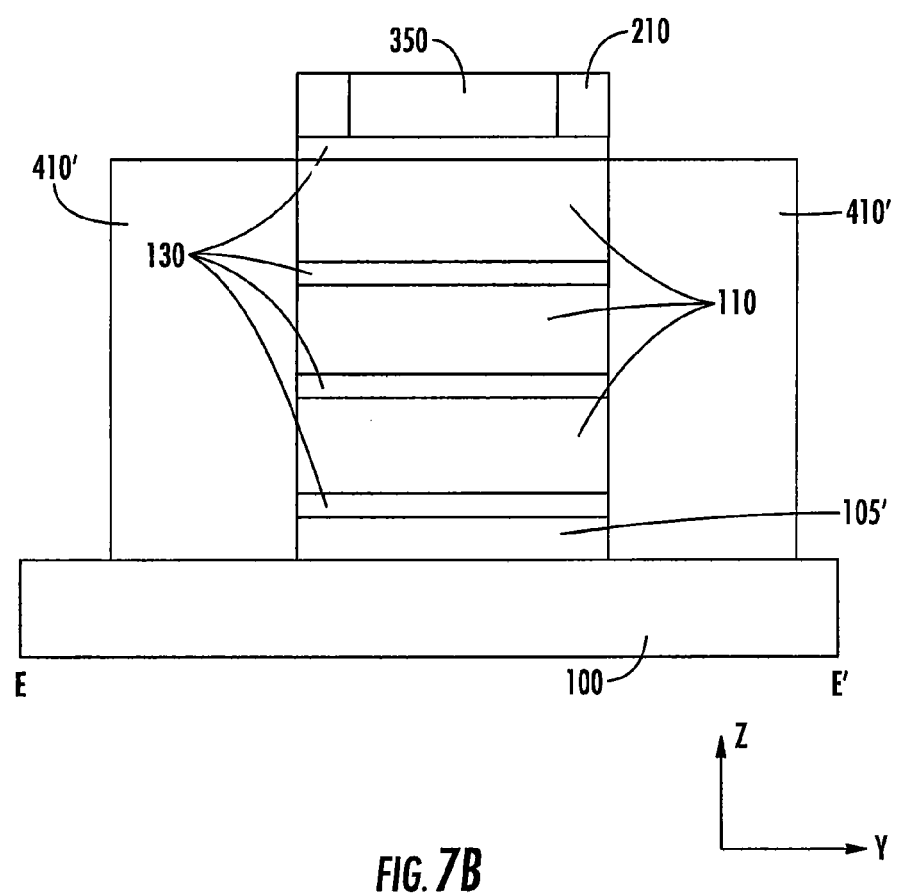

FIG. 7B is a cross sectional view taken along the line E-E' of FIG. 7A. Referring to FIGS. 7A and 7B, preliminary source/drain regions 410' may be formed on sides of the sacrificial gate 350. In some embodiments, the preliminary channel structures 150' may be recessed using the first spacers 210 and the sacrificial gate 350 as a mask and then the preliminary source/drain regions 410' may be formed using, for example, a doped epitaxial growth process using the preliminary channel structures 150' as seed layers. The epitaxial growth process may be performed until epitaxial layers grown from the preliminary channel structures 150' merge into and thus form the preliminary source/drain regions 410' that each has a unitary structure. In some embodiments, the preliminary source/drain regions 410' may be formed using a cladding epitaxial process without recessing the preliminary channel structures 150'.

Figure 8:
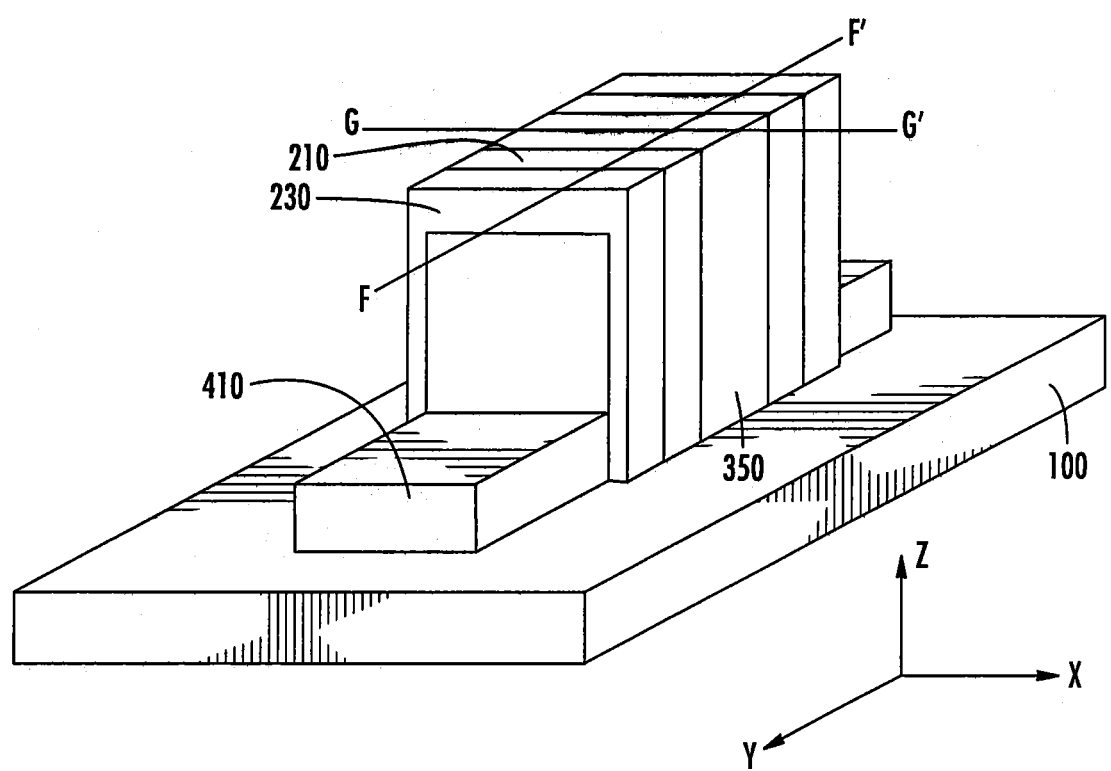

Referring to FIG. 8, second spacers 230 may be formed on the preliminary source/drain regions 410' and the preliminary source/drain regions 410' may be etched using the second spacers 230 as an etch mask to form source/drain regions 410. According to some embodiments of the present inventive concepts, stress in the channel layers 110 may not be induced by source/drain regions 410 and thus removing portions of the source/drain regions 410 may not reduce stress in the channel layers 110.

Figure 9A:
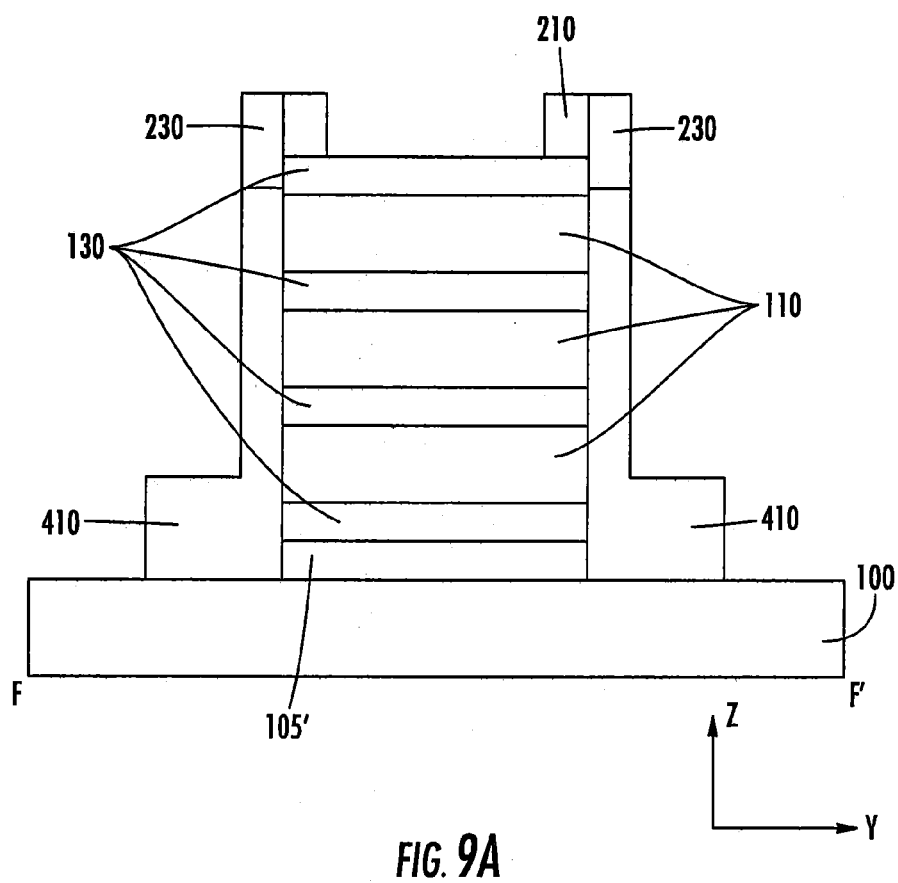
Figure 9B:
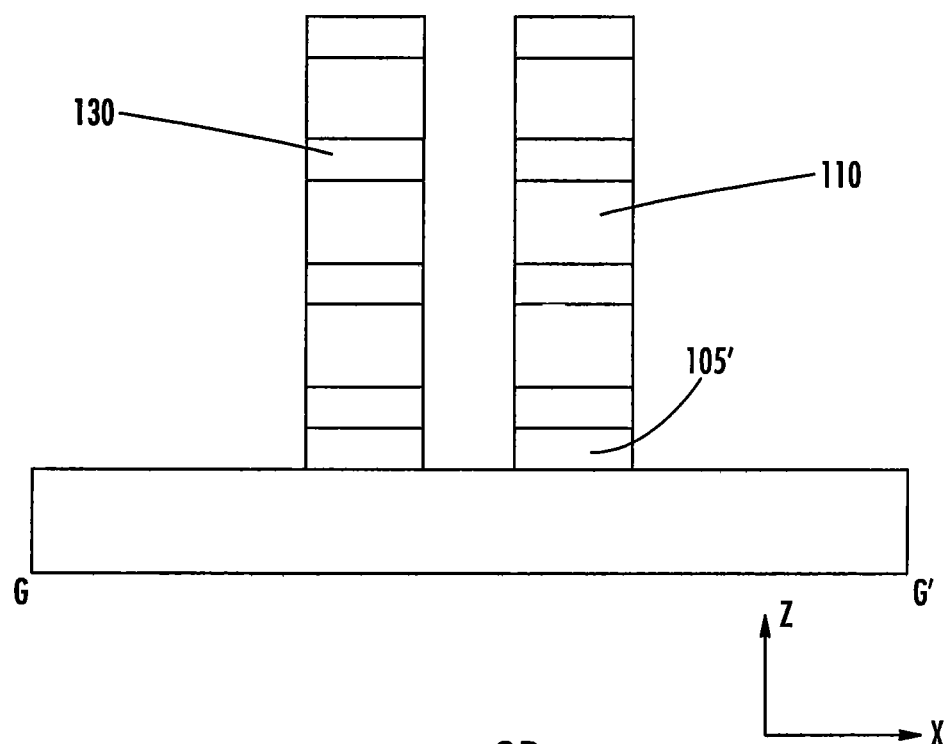

FIGS. 9A and 9B are cross sectional views taken along the lines F-F' and G-G' of FIG. 8, respectively. Referring to FIGS. 9A and 9B, the sacrificial gate 350 may be selectively removed and middle portions of the preliminary channel structures 150' may be exposed.

Figure 10A:
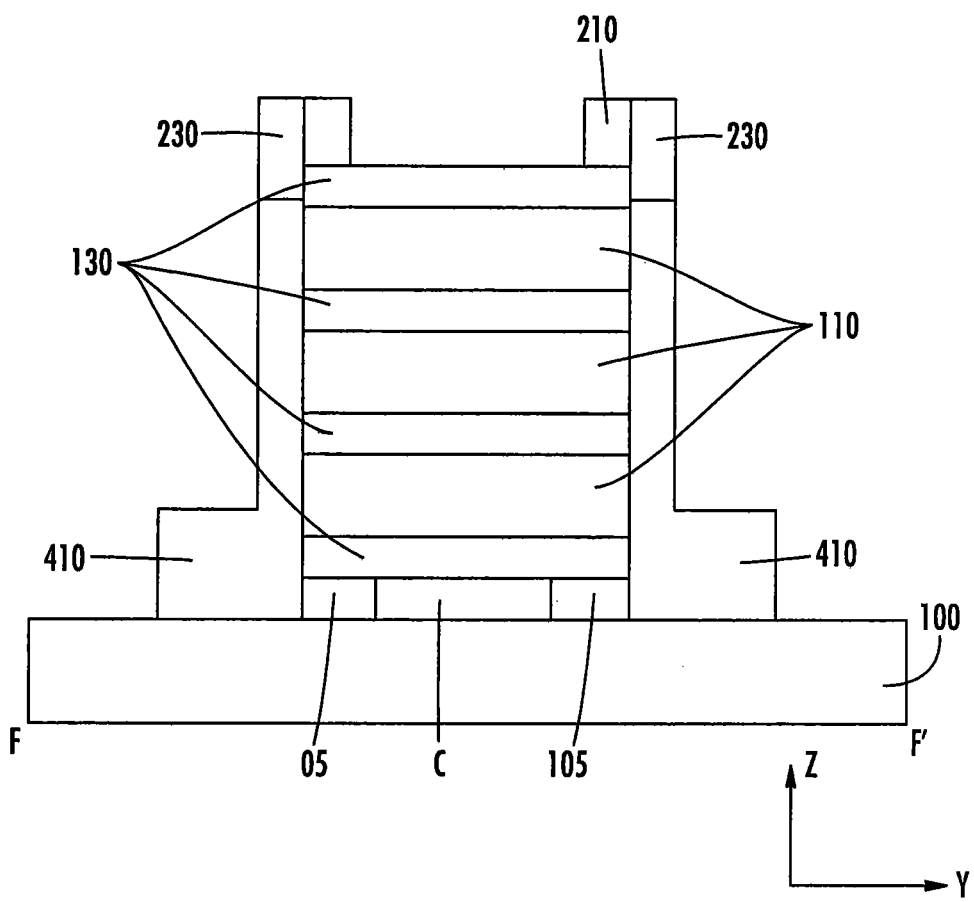
Figure 10B:
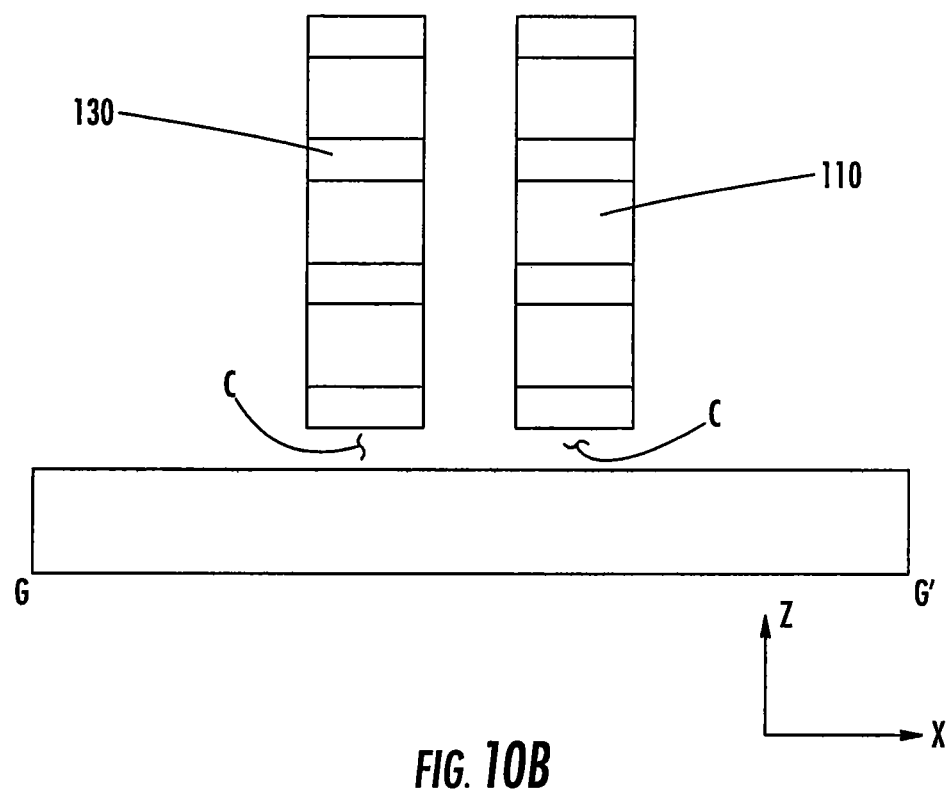

FIGS. 10A and 10B are cross sectional views taken along the lines F-F' and G-G' of FIG. 8, respectively. Referring to FIGS. 10A and 10B, the preliminary seed layer 105' may be selectively etched using the first spacers 210 as an etch mask to form seed layers 105. Cavities C may be formed under the channel structures 150 and thus the channel structures 150 may be spaced apart from the substrate 100. Since the channel structures 150 are not attached to the substrate 100, stress in the channel layers 100 may not be reduced, and the channel layers 100 may attain the desired strain state.

Referring again to FIGS. 2A and 2B, the gate insulating layer 310 and the gate electrode 330 may be formed on the channel structures 150.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

That which is claimed:

1. A field effect transistor, comprising:
 a fin shaped channel structure on a substrate, the channel structure comprising stressor layers stacked on the substrate and a channel layer between the stressor layers, the stressor layers comprising a semiconductor material having a wide bandgap that is sufficient to confine carriers to the channel layer and having a lattice constant different from a lattice constant of the channel layer to induce stress in the channel layer, and the channel structure comprising a top surface parallel to an upper surface of the substrate;
 source/drain regions on respective first opposing sides of the channel structure;
 a gate on second opposing sides of the channel structure and between the source/drain regions, wherein the second opposing sides of the channel structure extend from the top surface of the channel structure toward the substrate; and
 a gate insulating layer extending between the channel structure and the gate, the gate insulating layer comprising a dielectric layer.

2. The field effect transistor of claim 1, further comprising diffusion barrier layers between the channel layer and the stressor layers.

3. The field effect transistor of claim 2, wherein each of the diffusion barrier layers comprises Zinc sulfide (ZnS) and/or a group II-VI semiconductor material.

4. The field effect transistor of claim 1, wherein the field effect transistor comprises an N-type field effect transistor,
wherein the channel layer comprises silicon, and
wherein each of the stressor layers comprises beryllium telluride (BeTe), aluminum arsenide (AlAs), lanthanum oxide ($La_2O_3$) and/or zinc selenide (ZnSe).

5. The field effect transistor of claim 1, wherein the field effect transistor comprises a P-type field effect transistor,
wherein the channel layer comprises silicon germanium ($Si_{1-x}Ge_x$), and x is greater than 0.2, and
wherein each of the stressor layers comprises aluminum phosphide (AlP) and/or gallium phosphide (GaP).

6. The field effect transistor of claim 1, wherein the field effect transistor comprises a P-type field effect transistor,
wherein the channel layer comprises silicon germanium ($Si_{1-x}Ge_x$), and
wherein each of the stressor layers comprises beryllium sulfide (BeS) and/or beryllium selenide (BeSe).

7. The field effect transistor of claim 1, wherein the field effect transistor comprises a P-type field effect transistor,
wherein the channel layer comprises indium-gallium-antimonide ($In_xGa_{1-x}Sb$), and
wherein each of the stressor layers comprises $In_yGa_{1-y}Sb$, and x is greater than y.

8. The field effect transistor of claim 1, wherein the field effect transistor comprises a P-type field effect transistor,
wherein the channel layer comprises $In_xGa_{1-x}Sb$, and
wherein each of the stressor layers comprises aluminum antimonide (AlSb) and/or indium phosphide (InP).

9. The field effect transistor of claim 1, wherein the gate surrounds the channel structure.

10. The field effect transistor of claim 1, wherein opposing sides of the channel layer comprise the second opposing sides of the channel structure, respectively, and
wherein the gate insulating layer directly contacts the opposing sides of the channel layer.

11. The field effect transistor of claim 1, wherein the stressor layers comprise a plurality of stressor layers, the channel layer comprises a plurality of channel layers, and the plurality of stressor layers and the plurality of channel layers are stacked on the substrate in an alternating sequence, and
wherein the gate is not disposed between ones of the plurality of channel layers.

12. The field effect transistor of claim 11, wherein each of the plurality of channel layers has a thickness in a vertical direction that is perpendicular to the upper surface of the substrate in a range of about 4 nm to about 20 nm.

13. A field effect transistor, comprising:
a fin shaped channel structure on a substrate, the channel structure comprising stressor layers stacked on the substrate and a channel layer between the stressor layers, the stressor layers having a lattice constant different from a lattice constant of the channel layer to induce stress in the channel layer, and the channel structure comprising a top surface parallel to an upper surface of the substrate;
source/drain regions on respective first opposing sides of the channel structure;
a gate on second opposing sides of the channel structure and between the source/drain regions, wherein the second opposing sides of the channel structure extend from the top surface of the channel structure toward the substrate, and
wherein a portion of the gate separates the channel structure from the substrate; and
a gate insulating layer extending between the channel structure and the gate, the gate insulating layer comprising a dielectric layer.

14. The field effect transistor of claim 13, further comprising diffusion barrier layers between the channel layer and the stressor layers.

15. The field effect transistor of claim 14, wherein each of the diffusion barrier layers comprises zinc sulfide (ZnS) and/or a group II-VI semiconductor material.

16. The field effect transistor of claim 13, wherein the field effect transistor comprises an N-type field effect transistor,
wherein the channel layer comprises silicon, and
wherein each of the stressor layers comprises beryllium telluride (BeTe), aluminum arsenide (AlAs), lanthanum oxide ($La_2O_3$) and/or zinc selenide (ZnSe).

17. The field effect transistor of claim 13, wherein the field effect transistor comprises a P-type field effect transistor,
wherein the channel layer comprises silicon germanium ($Si_{1-x}Ge_x$), and x is greater than 0.2, and
wherein each of the stressor layers comprises aluminum phosphide (AlP) and/or gallium phosphide (GaP).

18. The field effect transistor of claim 13, wherein the field effect transistor comprises a P-type field effect transistor,
wherein the channel layer comprises silicon germanium ($Si_{1-x}Ge_x$), and
wherein each of the stressor layers comprises beryllium sulfide (BeS) and/or beryllium selenide (BeSe).

19. The field effect transistor of claim 13, wherein the field effect transistor comprises a P-type field effect transistor,
wherein the channel layer comprises indium-gallium-antimonide ($In_xGa_{1-x}Sb$), and
wherein each of the stressor layers comprises $In_yGa_{1-y}Sb$, and x is greater than y.

20. The field effect transistor of claim 13, wherein the field effect transistor comprises a P-type field effect transistor,
wherein the channel layer comprises indium-gallium-antimonide ($In_xGa_{1-x}Sb$), and
wherein each of the stressor layers comprises aluminum antimonide (AlSb) and/or indium phosphide (InP).

* * * * *